United States Patent [19]

Talbot et al.

[11] Patent Number: 5,357,116

[45] Date of Patent: Oct. 18, 1994

[54] FOCUSED ION BEAM PROCESSING WITH CHARGE CONTROL

[75] Inventors: Christopher G. Talbot, Menlo Park; Thomas M. Trexler, San Jose, both of Calif.

[73] Assignee: Schlumberger Technologies, Inc., San Jose, Calif.

[21] Appl. No.: 980,371

[22] Filed: Nov. 23, 1992

[51] Int. Cl.$^5$ .............................................. H01J 37/30
[52] U.S. Cl. ........................................................ 250/492.21
[58] Field of Search ............................. 250/309, 492.21

[56] References Cited

U.S. PATENT DOCUMENTS

| | | | |
|---|---|---|---|
| 4,419,203 | 12/1983 | Harper et al. | |
| 4,503,329 | 3/1985 | Yamaguchi et al. | |
| 4,564,880 | 1/1986 | Christ et al. | 361/212 |
| 4,609,809 | 9/1986 | Yamaguchi et al. | |
| 4,639,301 | 1/1987 | Doherty et al. | |
| 4,846,922 | 7/1989 | Benge et al. | 156/324 |
| 4,910,499 | 3/1990 | Benge et al. | 361/402 |
| 5,028,780 | 7/1991 | Kaito et al. | |
| 5,140,164 | 8/1992 | Talbot et al. | |

OTHER PUBLICATIONS

K. Wittmaack, *Primary-ion charge compensation in SIMS analysis of insulators*, J. Appl. Phys. 50(1), pp. 493-497, Jan. 1979.

*Primary Examiner*—Bruce C. Anderson
*Attorney, Agent, or Firm*—Kenneth Olsen; Keith G. W. Smith; Bruce D. Riter

[57] ABSTRACT

Focused ion beam (FIB) systems are used for IC mask or reticle repair and imaging and other applications. The impinging ions can cause an undesirable charge build-up on the specimen. Prior to beginning repair operations in a FIB system, a fluid containing a conductive material such as dimethyl ammonium salt is applied to the reticle, mask or device and allowed to dry, leaving a thin conductive layer on the specimen. A leakage path is preferably provided from the thin conductive layer to ground, to prevent charge buildup on the specimen. The FIB is used to cut through the conductive layer before commencing FIB deposition, to assure proper bonding of the deposited material. The technique also has application with electron beam imaging systems.

14 Claims, 2 Drawing Sheets

FOCUSED ION BEAM PROCESSING WITH CHARGE CONTROL

BACKGROUND OF THE INVENTION

1. Field of the Invention

The present invention relates to charged-particle beam processing. In particular, the present invention relates to methods of controlling charge-up of the target of a charged-particle beam such as a focused-ion beam (FIB) or electron beam.

2. The Prior Art

Reticles and masks are used during IC manufacturing to print circuit elements and wiring on silicon. Reticles are also used in the production of masks. Each individual reticle costs on the order of $2000 and typically requires two plus weeks to make. Mask production likewise involves substantial time and expense. The complete circuit patterning for a modern IC will typically require 10 to 20 or more reticles. The ability to modify or repair a reticle or mask quickly is valuable, saving turnaround time and costs.

Focused ion beams have been used for repair of optical masks and reticles since the mid-1980s. Reticles typically consist of an opaque thin film of metal, such as chromium, deposited in a pattern on a transparent substrate of quartz or glass. Masks are of similar construction. The ability of the FIB to accurately remove unwanted portions of the metal film and to deposit material to "edit" the pattern makes it potentially an almost ideal repair tool. However, the highly-insulating surface of the substrate and the electrically-floating patterns of metal film charge-up when the FIB is applied, causing severe beam drift. FIB milling and metal deposition is also used in the semiconductor industry for analysis and repair of integrated circuits.

In some FIB systems, an electron flood gun is used to minimize the charging problem and facilitate repair. For example, U.S. Pat. No. 4,639,301 to Doherty et al. describes a FIB system in which a beam of electrons is directed on the target to neutralize the charge created by the incident ion beam. U.S. Pat. No. 4,609,809 to Yamaguchi et al. describes a FIB system in which the ion beam is neutralized by an electron shower so as to prevent the wiring portion of an IC from being charged electrically.

U.S. Pat. No. 4,503,329 to Yamaguchi et al. describes an arrangement for ion beam machining of mask defects in which electron shower units are provided for neutralizing the ion beam. Alternatively, the electron shower units are directed to the surface of the specimen to prevent charging. In another embodiment, a prober attached to a grounded arm is placed in contact with a mask pattern, for discharge to ground of charges on the pattern when the ion beam is projected onto the specimen. In a further arrangement, the entire surface of the mask substrate is coated with a thin film of metal or conductive compound such as $In_2O_3$ or $SnO_2$ by evaporation. In this arrangement, charges on the mask pattern can be discharged to ground through a conductive clamp which fixes the substrate in a specimen tray.

Surface charging of the target specimen is also encountered in probing and imaging with electron beam systems. With either FIB or electron-beam systems, it is known to deposit a thin conducting layer of material (usually gold or carbon) on a sample prior to imaging to prevent surface charging by providing a leakage path to ground for surface charge. The coating is evaporated onto the specimen in a deposition chamber, after which the specimen is mounted (with suitable electrical contact from the conducting layer to ground) in the vacuum chamber of the FIB or electron-beam system for imaging.

It is also known to deposit a metal film on a specimen to be sectioned with a FIB for observation. For example, U.S. Pat. No. 5,028,780 to Kaito et al. discloses use of FIB and a source of $W(CO)_6$ gas to deposit a tungsten film locally in an area of the specimen where a trench is to be cut to expose a section for observation. The deposited tungsten film serves to level the top face of the sample in the area and to avoid distortion of the section which would otherwise be caused by redeposition of sputtered material.

The use of electron beams or showers for charge neutralization has drawbacks. For example, the cost and complexity of the required FIB system is increased, and today's commercial FIB reticle repair systems with electron-flood guns can only neutralize relatively low mean beam current densities from the FIB, thus slowing the repair process.

The use of a prober in contact with a mask pattern also has drawbacks. The cost and complexity of operating a prober within the evacuated specimen chamber is a consideration. Also, a probe in contact with one portion of the pattern may not adequately discharge the surface charges on the mask if adjacent portions of the pattern and the insulative substrate are allowed to charge-up as the ion beam is applied.

Evaporating conductive coatings onto the specimen also has drawbacks. Additional equipment is required for deposition and/or removal of the coating. The coating may interfere with bonding of material to be deposited when effecting a repair, and can be difficult to remove. Typically, a carbon coat can be removed from the surface of an IC specimen with an oxygen plasma, but semiconductor manufacturers are reluctant to expose reticles to an oxygen plasma as it adds an additional complex and time consuming handling step and may degrade the optical qualities of the substrate.

SUMMARY OF THE INVENTION

The present invention offers a simple and inexpensive technique for controlling charge-up of a specimen during processing with a FIB or electron-beam system. The technique is particularly suitable for FIB modification and repair of masks and reticles used in semiconductor device manufacture.

In accordance with a preferred embodiment of the invention, an anti-static material, such as a volatile fluid containing dimethyl ammonium salt, is applied to the reticle, mask or other specimen of interest prior to beginning repair operations in a FIB system. The volatile fluid is allowed to evaporate, leaving a conductive layer of anti-static material. The FIB is used to cut through the layer of anti-static material before commencing FIB deposition, to assure proper bonding of deposited repair material.

These and other features of the invention will become apparent to those of skill in the art from the following description of preferred embodiments of the invention and the accompanying drawing figures.

DESCRIPTION OF THE PREFERRED EMBODIMENTS

Figure 1:
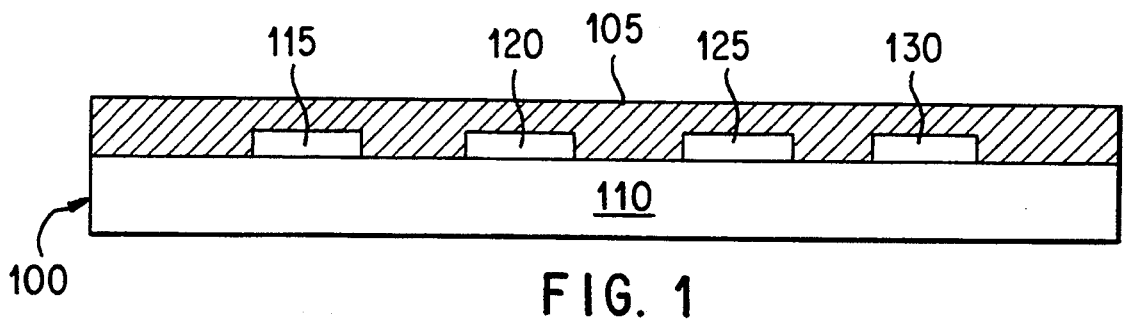
FIG. 1 is a schematic sectional view of a portion of a reticle to which an anti-static static material has been applied in accordance with the invention.

A FIB system suitable for carrying out the methods of the present invention is the IDS 7000 FIBstation ™, available commercially from Schlumberger Technologies, Inc., of San Jose, Calif. Such a system is described, for example, in U.S. Pat. No. 5,140,164 to Talbot et al., the content of which is incorporated herein by this reference.

In accordance with preferred embodiments of the invention, an anti-static fluid is applied to a specimen to form a thin conducting layer for neutralization of charge build-up from an incident charged-particle beam.

The anti-static fluid comprises a conductive material, such as dimethyl ammonium salts, in a volatile liquid carrier, such as water and/or alcohol. The anti-static fluid is preferably capable of being applied to the specimen by swabbing or spraying under room ambient conditions, and rapidly air-dried to form on the specimen a mildly conductive layer having sheet resistance of less than about $10^{12}$ ohms/square, preferably less than about $10^9$ ohms/square. The conductive layer must remain at least mildly conductive in the vacuum environment of a FIB or e-beam system, and should be readily removable from the specimen using common solvents under room ambient conditions without need for special equipment, e.g., by rinsing with isopropyl alcohol or water. (If the surface potential of a specimen were grounded through one square of conductive layer having a sheet resistance of one gigohm per square, the surface potential would be expected to vary by one volt at one nanoampere of net injected beam current, where the net injected beam current is the difference between the primary beam current incident on the specimen and the secondary current from the specimen. A one-volt change in surface potential on the specimen would not be expected to significantly deflect a 25 keV charged-particle beam.) A sheet resistance value of $10^9$ ohms/square with a conductive layer thickness of 1 $\mu$m corresponds to a bulk resistivity of $10^{11}$ $\mu$-ohm-cm.

A preferred anti-static fluid is "Staticide ® General Purpose #2001," commercially available from ACL Incorporated of Elk Grove Village, Ill. "Staticide" is a registered trademark of ACL Incorporated. Staticide ® General Purpose #2001 is described by ACL Incorporated as an anti-static agent of the chemical family of quaternary ammonium compounds in water solution (a mixture comprising Alkyl Dimethyl Aryl Ammonium Salts, Alkyl Dimethyl Ethylaryl Ammonium Salts, Modified N-Alkyl Dimethyl Ammonium Salts, Isopropanol, Water and Fragrance), having a specific gravity of 0.99, an estimated vapor pressure of 18 at 20° C., an estimated vapor density of 2 (air=1), an estimated evaporation rate of 1 (water =1), a boiling point of 100° C., a freezing point of 0° C., solubility in water at 20° C. "miscible," 99+% volatile by volume, with a pH of 7.1±1, and a density of 0.99 g/ml. Active ingredients of Staticide ® General Purpose #2001 are modified N-Alkyl Dimethyl Ammonium Salts (1.36%), N-alkyl Dimethyl Benzyl Ammonium Salts (0.06%), and N-Alkyl Dimethyl Ethyl Benzyl Ammonium Salts (0.06%). ACL Incorporated quote sheet resistances of Staticide ® General Purpose #2001 from $10^6$ ohms/square to $10^{12}$ ohms/square depending on conditions of the surface to which it is applied.

The anti-static fluid is applied to the surface of the specimen with a cotton swab, or is sprayed on or is applied in any other suitable manner. The volatile liquid carrier is then allowed to evaporate (e.g., by air-drying or by application of a stream of air), leaving a thin layer of the conductive material on the surface of the specimen in the region where the repair is to be made. While thickness of the layer of conductive material is generally not critical, it has been found that a layer of approximately 1 $\mu$m thickness is suitable for reticle repair and is readily achieved by application of the anti-static fluid with a cotton swab. Those of skill in the art will recognized that a dynamic equilibrium between milling with a FIB and the redeposition of milled material of the region being milled can arise when the depth of a hole milled with a FIB becomes much larger than the diameter of the milled hole (e.g., depth/diameter greater than about 6/1), unless a gas is injected to enhance the FIB milling rate. Once the liquid carrier has evaporated, the remaining layer of conductive material preferably has a low vapor pressure to allow good vacuum in the FIB chamber.

FIG. 1 is a schematic sectional view of a portion of a reticle 100 on the surface of which is a thin layer 105 of conductive material applied in accordance with the invention. Reticle 100 comprises a transparent, insulative substrate 110 (e.g., of quartz) having an opaque pattern (e.g., of chromium) deposited on one face. As illustrated, the pattern comprises a series of traces 115, 120, 125 and 130.

Figure 2:
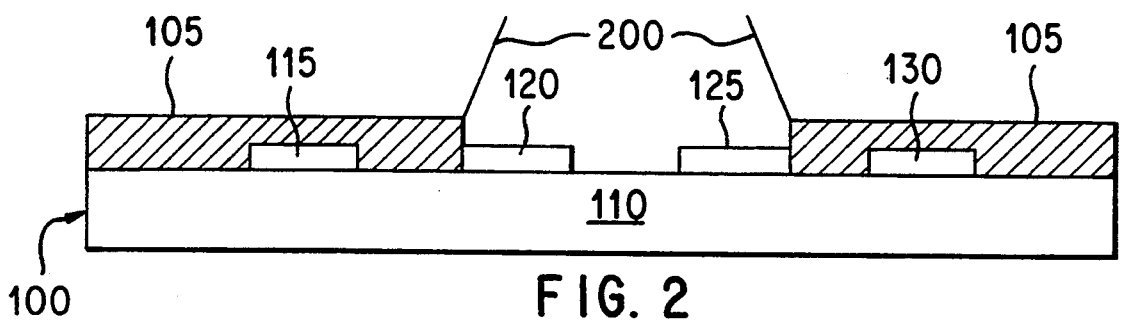
FIG. 2 is a schematic sectional view of the reticle of FIG. 1, illustrating the use of a FIB to pre-sputter the anti-static material in accordance with the invention.

Reticle 100, with the applied layer 105 of conductive material, is placed in the vacuum chamber (not illustrated) of a FIB system. Conductive layer 105 may be grounded as will be explained below. The chamber is evacuated, and a FIB is then raster-scanned to pre-sputter the region of the specimen where repair is to be made, to locally remove the layer 105 of conductive material in the region where material is to be cut or deposited. Pre-sputtering usually takes a few tens of seconds, depending on the area to be exposed, the FIB beam current level and the type of anti-static fluid employed. Normal FIB end-point detection techniques work well (e.g., monitoring for change in the secondary particle count, most frequently electrons) and provides a clear signal when the surface of the reticle is exposed. Scanning of the FIB is shown schematically by lines 200 in FIG. 2. In the illustration of FIG. 2, the FIB has been used to remove a portion of conductive layer 105 to expose chromium traces 120 and 125 and the region of substrate 110 lying between them.

Figure 3:
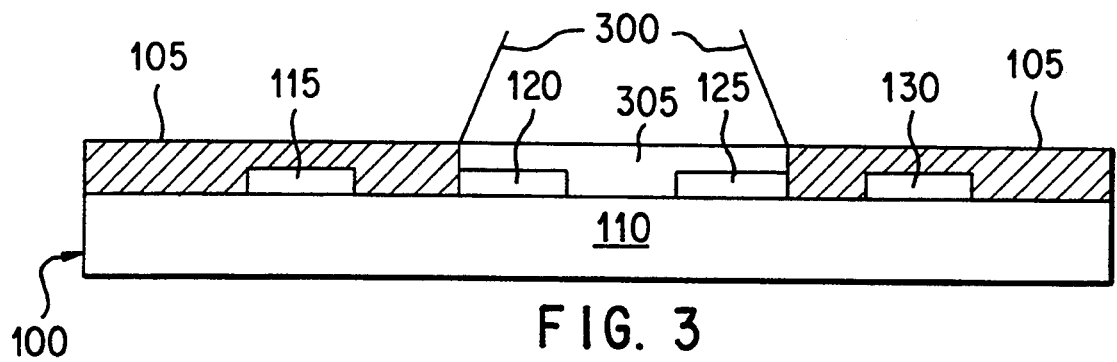
FIG. 3 is a schematic sectional view of the reticle of FIG. 2, illustrating the use of a FIB to deposit opaque material in accordance with the invention.

Suitable material can then be introduced in the vacuum chamber as the FIB is raster-scanned over the region where the repair is to be made, to cause deposition of opaque material in a manner known in the art. In the example of FIG. 3, opaque material 305 is deposited as the FIB is scanned over the region as shown by lines 300.

Figure 4:
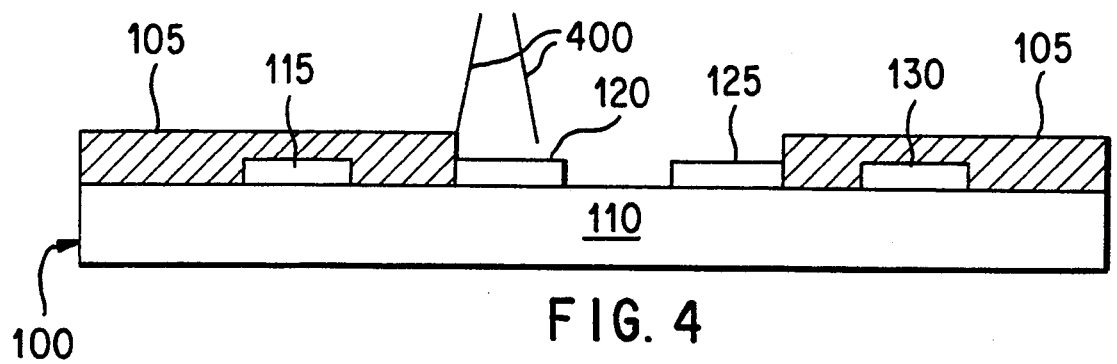
FIG. 4 is a schematic sectional view of the reticle of FIG. 2, illustrating the use of a FIB to remove a portion of the metal film in accordance with the invention.

The FIB can also be used to remove opaque material in prior-art fashion. As shown in FIG. 4, a portion of the opaque pattern (in this example, trace 120) is removed by scanning of the FIB over the region as shown by lines 400.

Figure 5:
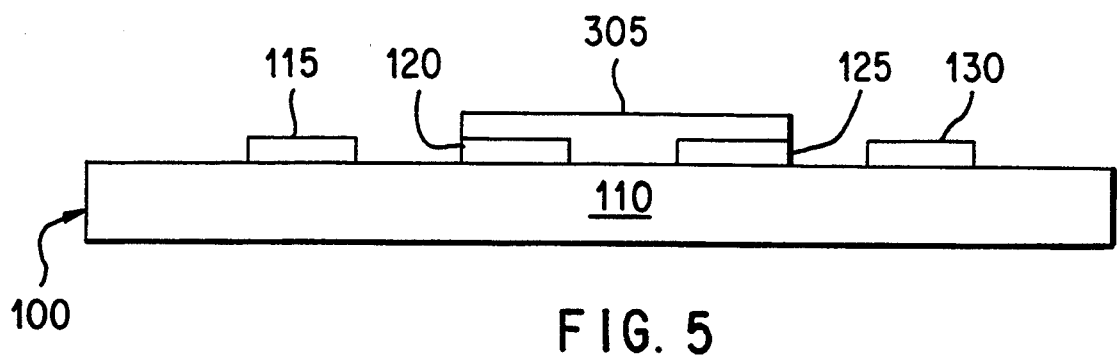
FIG. 5 is a schematic sectional view of the reticle of FIG. 3, following removal of the anti-static material.

After the repair is completed, the reticle is removed from the vacuum chamber and conductive layer 105 is removed, e.g., with a suitable solvent. FIG. 5 shows the repaired reticle of FIG. 3 following removal of conductive layer 105.

As noted above, conductive layer 105 may be grounded, though such grounding may not always be necessary. First, the anti-static material of conductive layer 105 may itself have sufficient charge-gathering capability. Second, charge leakage at the edges of conductive layer 105 increases as the area of conductive layer 105 increases. If a large enough area of the specimen is covered with the conductive layer 105 relative to the area of the specimen to be worked with the charged-particle beam, such charge-gathering and charge leakage may not need to be supplemented with grounding of conductive layer 105.

Figure 6:
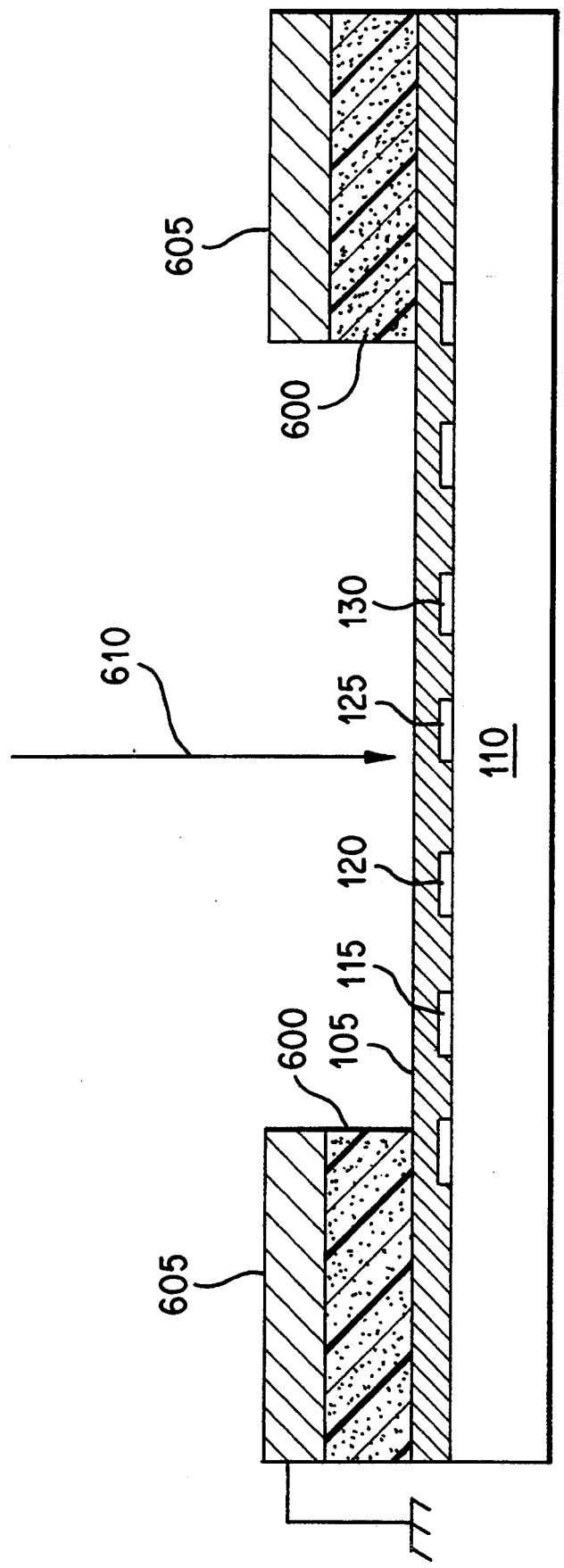
FIG. 6 is a schematic sectional view of the reticle of FIG. 1, illustrating a manner of effecting electrical contact with the anti-static material.

FIG. 6 illustrates a preferred method of grounding conductive layer 105 in the event such grounding is necessary or desired. A layer of conductive foam 600 having a central opening (e.g., 1×1 cm opening) is laid on the surface of reticle 100 in contact with conductive layer 105. Conductive foam 600 is held firmly in place by a grounded, metal pressure plate 605. The combination of conductive layer 105, conductive foam 605 and grounded pressure plate 605 provide a good leakage path to ground for surface charge, thus preventing beam drift. The FIB is shown at 610.

One type of conductive foam material 600 which may be used is a foam material having a silicone elastomer binder with a conductive filler of silver, commercially available under the trade name CHO-FOAM 1501 from Chomerics Inc. of Woburn, Mass. Other suitable materials may be used in place of conductive foam material, such as an elastomeric conductive polymer interconnect (ECPI) material. ECPI materials are available from the Engineering Research Center of AT&T Bell Laboratories, Hocewell, N.J.

A key advantage of using anti-static fluid in accordance with the invention to apply a conductive layer for neutralizing charge is that, unlike prior-art surface films of carbon or metal, the conductive layer 105 is easily removed with a solvent. For example, isopropyl alcohol works well as a solvent for removing dimethyl ammonium salts. In many cases, removal of conductive layer 105 after repair adds no steps to the overall process as the reticle is always thoroughly cleaned prior to return to the fabrication line for actual use.

Another advantage of using anti-static fluid in accordance with the invention arises from the fact that, during FIB imaging, the upper surface of conductive layer 105 is exposed to the beam. Extended exposure of the quartz substrate's surface to the FIB degrades the optical qualities of the surface and can cause problems during printing. Conductive layer 105 in this way acts as a protective coating during the FIB repair process.

Reticle Repair Example

A reticle was to be repaired by depositing an opaque line ("strap") to interconnect two opaque regions. The reticle was coated with a layer of anti-static fluid, Staticide ® General Purpose #2001, applied with a Q-Tip cotton swab and allowed to air dry for about ½ minute. The reticle was placed in the FIB chamber and conductive foam was used to establish electrical connection from the conductive salt layer on the reticle to a ground conductor. After evacuating the chamber, the FIB was operated to sputter away the conductive dimethyl ammonium salt layer overlying the region where opaque material was to be deposited to effect the repair. To do this, a 5×5 $\mu$m hole was sputtered through the conductive salt layer overlying each of the two opaque regions, and then a trench was sputtered through the conductive salt layer overlying the area joining the two opaque regions. The 5×5 $\mu$m holes were sputtered through the conductive salt layer in about 4 seconds with a beam current density of about 5 A/cm$^2$, a FIB current of about 500 picoamperes, and a spot size of about 100-150 nanometers. The trench was sputtered with a FIB current of about 6 nanoamperes and a spot size of about 250 nanometers. (The FIB currents, which determine spot size, were selected based on the reticle feature size, which in this case was 5× the feature size of the mask and IC to be produced from the reticle. Lower beam current and a smaller spot size would be used for features of smaller dimension. Removal of the conductive salt layer in the region where opaque material is to be deposited assures proper bonding of the deposited opaque material to the reticle and reduces the possibility of the deposited opaque material being damaged or washed away when the conductive salt layer is later removed.) Opaque metallic platinum was then deposited in the holes and the trench by introducing trimethyl-methyl-cyclo-penta-dienyl-platinum gas in the presence of the FIB. The platinum strap, covering a 40×8 $\mu$m region, was deposited using a FIB current of about 2 nanoamperes for about 10 minutes. The deposit was examined by FIB imaging and with an optical microscope, and was determined to be a successful repair as evidenced by opacity of the reticle in the region of the strap. No problem was encountered with FIB drift or specimen surface charging, as evidenced by a stable FIB image on the display screen. The conductive layer of dimethyl ammonium salt was removed with isopropyl alcohol after reticle repair.

Variations of the above-described methods are possible within the spirit and scope of the invention. For example, it may be desired to control surface charging of a specimen when using a FIB or electron beam to image the specimen. The anti-static fluid is applied and allowed to dry prior to sectioning of a specimen (e.g., an IC specimen), leaving a thin layer of conductive material on the surface of the specimen. The specimen can then be sectioned using a FIB or by mechanical milling, and the cut face of the section imaged using a FIB or electron beam. Referring to FIG. 6, a specimen can be sectioned with a FIB by scanning the FIB in a plane passing through the specimen. It is known in the art that, when sectioning a specimen with a FIB, it is useful to have a layer of material which will protect structure of the specimen adjacent to the cut face, as specimen material redeposited during sputtering can obscure the true dimensions of the specimen's structure. When a FIB is used for sectioning, a leakage path is preferably provided from the layer of conductive material. After sectioning, a leakage path is preferably provided from the layer of conductive material (for example, as shown in FIG. 6) as the FIB or electron beam is scanned over the cut face of the sectioned specimen (with the beam impinging generally perpendicular to the cut face), and secondary particles (electrons or ions) are detected to produce a signal from which an image of the cut face of the section is generated.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

As used in the claims which follow, the term "reticle" is intended to include a reticle or mask or similar structure comprising essentially a transparent insulative substrate (e.g., of glass or quartz) having a pattern of opaque material (e.g., of chromium) deposited thereon. The term "specimen" is intended to include a reticle, mask or similar structure, or an integrated circuit (IC) or multi-chip module (MCM) or other device.

We claim:

1. A method of controlling charge build-up on a specimen to which a focused charged-particle beam is applied, comprising the steps of:
    a. applying an anti-static fluid to a surface region of a specimen, the fluid comprising a mixture of a volatile liquid carrier and a conductive material;
    b. allowing said liquid carrier to evaporate such that a layer of said conductive material remains on the surface region of the specimen;
    c. scanning a focused charged-particle beam over a portion of said region to sputter away the layer of conductive material over said portion for exposing a surface area of the specimen to the charged-particle beam;
    d. applying the focused charged-particle beam to said exposed surface area to modify the specimen; and
    e. applying a solvent to the specimen to remove any of said conductive material remaining on the surface region of the specimen following modification of the specimen in step d.

2. The method of claim 1, wherein step a. comprises swabbing said surface region with a mixture comprising dimethyl ammonium salt and water.

3. The method of claim 1, wherein step a. comprises spraying onto said surface region a mixture comprising dimethyl ammonium salt and water.

4. The method of claim 1, further comprising, prior to step c., the step of establishing electrical, connection with said layer of conductive material to provide a charge leakage path from said conductive material.

5. The method of claim 4, wherein said step of establishing electrical connection comprises pressing a conductive foam against said conductive layer with a grounded, conductive pressure plate.

6. The method of claim 4, wherein said step of establishing electrical connection comprises pressing a layer of elastomeric conductive polymer interconnect material against said conductive layer with a grounded, conductive pressure plate.

7. The method of claim 1, wherein step a. comprises applying to said surface region a mixture comprising quaternary ammonium compounds in water solution.

8. The method of claim 1, wherein step a. comprises applying to said surface region a mixture comprising alkyl dimethyl aryl ammonium salts, alkyl dimethyl ethylaryl ammonium salts, modified N-alkyl dimethyl ammonium salts, isopropanol and water.

9. The method of claim 1, wherein step a. comprises applying to said surface region a mixture comprising about 1.36% N-alkyl dimethyl ammonium salts, about 0.06% N-alkyl dimethyl benzyl ammonium salts, about 0.06% N-alkyl dimethyl ethyl benzyl ammonium salts, isopropanol and water.

10. The method of claim 1, wherein step f. comprises applying isopropyl alcohol to the specimen to remove any of said conductive material remaining on the surface region of the specimen following modification of the specimen in step d.

11. The method of claim 1, wherein said specimen is an integrated circuit device.

12. The method of claim 1, wherein said specimen is a multi-chip module.

13. The method of claim 1, wherein said specimen is a mask.

14. The method of claim 1, wherein said specimen is a reticle.

* * * * *